March 3, 1964

L. V. TARDOSKEGYI 3,123,084

ULTRASONIC PROCESSING APPARATUS

Filed March 27, 1963

INVENTOR
LOUIS V. TARDOSKEGYI
BY
Blum, Moscovitz, Friedman, Blum & Kaplan
ATTORNEYS.

United States Patent Office 3,123,084
Patented Mar. 3, 1964

3,123,084

ULTRASONIC PROCESSING APPARATUS

Louis V. Tardoskegyi, Montreal, Quebec, Canada, assignor to Electrovert Manufacturing Co., Ltd., Montreal, Quebec, Canada, a corporation of Canada Filed Mar. 27, 1963, Ser. No. 268,220
9 Claims. (Cl. 134—182)

Figure 1:
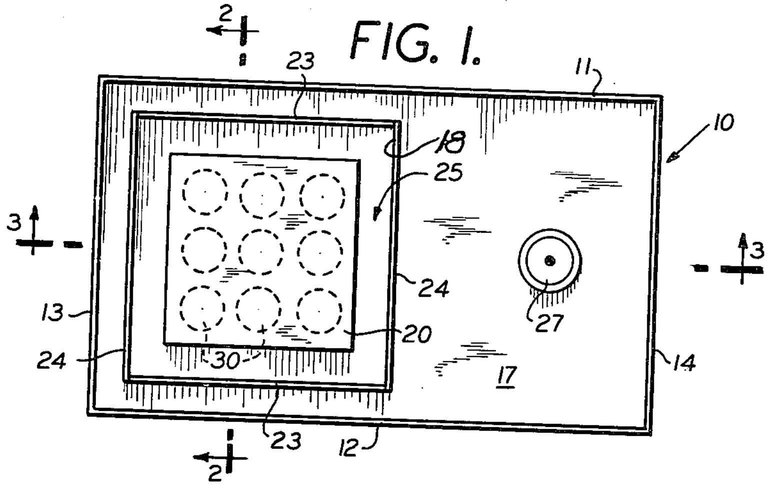

This invention relates to processing apparatus and, more particularly, to an improved ultrasonic processing apparatus which may be used in a processing line along which workpieces having surfaces to be processed are continuously moved in a direction substantially parallel to a horizontal plane, and without requiring any dipping of the workpiece into a tank or the like.

It is known to process workpieces by ultrasonic energy usually using a tank containing a liquid which is ultrasonically energized and in which the workpieces are dipped. An arrangement of this type, while effective to apply ultrasonic energy to process a workpiece, has a disadvantage, among others, that it cannot be used in an assembly line or processing line wherein the workpieces to be processed move continuously substantially parallel to a horizontal line. Consequently, ultrasonic processing utilizing known procedures generally has been a batch or single piece operation as distinguished from an assembly line operation.

Such batch processing is disadvantageous in many applications, among which may be mentioned, by way of example only, the processing of printed circuit boards. In the processing of such boards after the printed circuits have been printed thereon, it is necessary to make connections between the printed circuitry and components which are mounted on the circuit board. These connections are effected most advantageously by soldering. This requires first the cleaning of the surface having the connections to be soldered, as such surfaces may have become soiled in various ways due to handling of the printed circuit board. After the cleaning operation, the surfaces to be soldered must have a flux applied thereto or must be "fluxed." Following this operation, the terminals or connections to be soldered are passed through liquid solder or as to make soldered connections between the printed circuits and the components to be electrically connected thereto.

When a batch ultrasonic cleaning or processing operation is used with printed circuit boards, for example, the ultrasonic energy used in the processing may adversely affect such of the electrical components mounted on the printed board as may have resonant frequencies corresponding to the frequency of the ultrasonic energy. This has mitigated against the use of the batch or tank method of ultrasonically processing printed circuit boards. The mention of printed circuit boards herein is given by way of example only, and not by way of limitation, as many other types of articles are well adapted for ultrasonic processing.

It has also been proposed, particularly in soldering applications, to utilize a nozzle having a relatively narrow and elongated aperture which is ultrasonically energized to produce a standing wave of processing liquid, for example, molten solder. This arrangement, involving a nozzle which has a relatively narrow aperture to produce an ultrasonically energized standing wave of processing liquid, has not worked out well in practice, and has fallen somewhat into discard.

An object of the present invention is to provide an ultrasonic processing apparatus which is free of the disadvantages of prior art arrangements and which may be used in an assembly line operation, wherein re-orientation of the articles to be processed is not necessary and the surfaces to be processed may be moved continuously along a processing line and parallel to a generally horizontal plane.

Thus, the ultrasonic processing apparatus of the invention includes means providing a substantially flat and substantially horizontal platform of relatively large area, and which is preferably quadrilateral, such as a square or a rectangle. This platform is disposed in a path, such as an assembly or processing line along which workpieces having surfaces to be processed are moved substantially horizontally.

In accordance with the invention, the apparatus includes means defining an upwardly opening channel around the periphery of the platform, and ultrasonic transducer means connected to the platform to transmit ultrasonic vibrations thereto. Means are provided for supplying a processing liquid under pressure to the channel for pressure flow upwardly therein to cover the upper surface of the platform. This provides an ultrasonically energized free standing wave which is elevated above the platform for contact with the workpiece surfaces to be processed. Further means are provided for continuously re-circulating excess liquid to the supplying means.

It will be appreciated that, due to the provision of the free standing ultrasonically energized wave extending above the platform and, actually, additionally over the area of the upwardly opening channel, the articles to be processed may be moved in a horizontal path along the processing line so that their surfaces may contact or even be somewhat immersed in the free standing wave.

Articles of the nature of printed circuit boards, which are substantially flat boards, may be processed in either one of two ways. Thus, a board can be passed along the processing line at such an elevation that only its undersurface, containing connections to be cleaned, fluxed and soldered, may be in contact with the free standing wave, or the board may be slightly immersed in the free standing wave to an extent such that the upper surface of the board is contacted by the wave but without there being any substantial contact of the wave with electrical or electronic components mounted on such upper surface.

By the term processing liquid, as used herein, is meant any substance in the liquid state as distinguished from a substance in a solid state or in a gaseous state. This term liquid thus includes molten metals, viscous substances, suspensions of solids in a liquid vehicle, and any other fluid having the nature of a liquid or in a liquid state.

Figure 2:
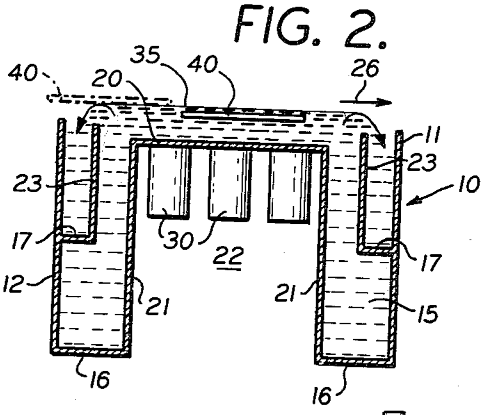
Figure 3:
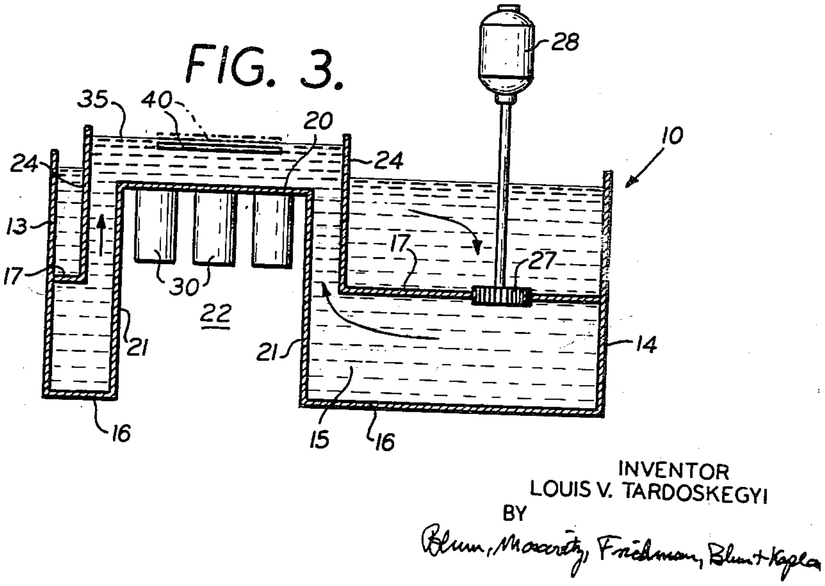

For an understanding of the principles of the invention, reference is made to the following description of a typical embodiment thereof as illustrated in the accompanying drawings. In the drawings:

FIG. 1 is a top plan view of ultrasonic processing apparatus embodying the invention; and FIGS. 2 and 3 are vertical sectional views of the apparatus taken on the correspondingly numbered lines of FIG. 1.

Referring to the drawings, the apparatus is illustrated as including a relatively large tank 10 arranged to contain the treating liquid 15. Tank 10 is preferably rectangular in plan, although it will be appreciated that the particular configuration in a horizontal plane is unimportant. The tank includes side walls 11 through 14, and a bottom wall 16.

The above-mentioned substantially horizontal platform is indicated at 20 as supported at an elevation near the upper edge of the tank 10. In the particular embodiment illustrated, platform 20 is indicated as a rectangle and preferably as a square, but it should be understood that the tank may have other shapes in plan, such as circular or oval, for example. However, the square or rectangular shape is particularly well adapted when the apparatus is to be used in a processing or assembly line.

Platform 20 is supported upon four vertical walls indicated at 21, these walls extending upwardly from the bottom wall 16 of tank 10. Preferably, bottom wall 16 is provided with an opening bounded by the walls 21 so as to define an accessible compartment 22 beneath the platform 20.

The upper portions of walls 21 also form the inner walls of an upwardly opening channel extending completely around the periphery of the platform 20, this channel being generally indicated at 25. The outer walls of channel 25 are defined by two pairs of parallel partition walls 23 and 24, which extend vertically upwardly from a horizontal partition 17 in tank 10 disposed intermediate the height of the tank.

As stated, the apparatus is arranged to be positioned in an assembly or processing line along which the articles or workpieces to be processed move substantially horizontally. Partition walls 23, which extend transversely of the line of travel as indicated by the arrow 26 in FIG. 2, extend only a short distance above the upper surface of platform 20 and preferably terminate somewhat short of the upper end of the side walls of tank 10. However, the partition walls 24, which are perpendicular to the partition walls 23 and which are parallel to the direction of travel of the workpieces, extend a substantially greater distance upwardly, as particularly illustrated in FIG. 3, for a purpose to be described. It will be noted that horizontal partition 17 is provided with a rectangular opening 18 defined by partition walls 23 and 24. Support walls 21 for platform 20 extend through this opening in spaced relation to partition walls 23 and 24 to define channel 25 extending completely around the periphery of platform 20.

Partition 17 divides tank 15 into an upper section, which receives the excess liquid from the channel 25, and a lower section in communication with the entrance end of channel 25. To maintain the fluid in the lower section under pressure and thus to maintain the fluid in channel 25 under an upward pressure, partition 17 is formed with a further opening in which there is disposed a suitable pump 27 schematically illustrated as driven by an electric motor or the like 28. Pump 27 has its intake in the upper section of tank 10 and its output in the lower section of the tank. Pump 27 thus withdraws liquid from the upper section of tank 10 and forces it under pressure into the lower section of the tank, thus maintaining a super-atmospheric pressure in the lower portion of tank 10 and upwardly in channel 25. This super-atmospheric pressure is maintained throughout the length of channel 25 so that there is a super-atmospheric pressure maintained in the liquid around the entire periphery of platform 20. There is a continuous circulation of liquid 15, with the liquid spilling over partition walls 23, as indicated by the arrows 19 in FIG. 2, to flow into the upper section of tank 15, which is in communication with the area between partitions 23, 24 and the side walls of tank 10.

In accordance with the invention, a plurality of ultrasonic transducers 30 are secured to the undersurface of platform 20 and disposed within compartment 22. These ultrasonic transducers are preferably arranged at regularly spaced locations along platform 20 and impart an ultrasonic vibration to platform 20. As a result of the ultrasonic vibrations imparted to platform 20, plus the pressurized fluid in channel 25 maintaining a layer of liquid 15 over the upper surface of platform 20, there is created an ultrasonically energized free standing wave 35 extending over the upper surface of platform 20 and outwardly over the cross sectional area of channel 25. This wave is confined laterally by the higher partition walls 24, and the excess liquid may flow over the lower partition walls 23 back into the upper section of tank 10.

The combination of the pressurized fluid in channel 25, plus the ultrasonic vibration of the relatively wide and relatively long platform 20, results in a relatively large area standing wave 35 which may extend to a substantial elevation above the upper surface of platform 20. This wave may be used to process ultrasonically articles 40 moving along an assembly line or a processing line.

Articles 40 may be, for example, flat plates, a traveling web, cylindrical articles, or any article or workpiece which travels in a substantially horizontal plane. As schematically illustrated in FIG. 3, if it is desired to process ultrasonically only the lower surfaces of articles 40, the latter are maintained at a travel elevation such that only their lower surfaces are in contact with free standing wave 35. However, in some cases, it may be desirable or necessary to process both surfaces of a relatively flat article, such as a printed circuit board. In such latter case, the article is maintained at a travel elevation such that it will actually pass through standing wave 35, being immersed to only a very small depth therein sufficient only for a portion of the wave to contact the upper surface of the article. These two alternative arrangements are both illustrated in FIG. 3. The partitions 24 provide guiding means for articles 40 traveling along the assembly or processing path and over, or slightly immersed through, standing wave 35.

Among other novel advantages of the invention, as compared to the prior art, is the fact that, where soldered connections are to be made, both a cleaning and fluxing operation, may be effected in a single operation as distinguished from the two separate operations previously required. Also, the apparatus of the invention is very well adapted for incorporation in an assembly or production line, and eliminates the need for batch processing where ultrasonic processing is desired. The relatively wide area of platform 20 and of the embracing cross sectional area of channel 25 provides such a relatively wide area for standing wave 35 that dipping or otherwise processing the parts is no longer necessary, thus eliminating the disadvantages, from the production standpoint, of known prior art methods.

It should be observed that the combination of the standing ultrasonic wave plus the continuous re-circulation of the liquid results in a combined washing action and cavitation effect. This is an advantage over the prior art wherein either a cavitation effect or a washing effect could be obtained, but not both with a single passage of workpieces through a processing liquid. A further advantage is that the ultrasonic energization of the liquid, plus the continuous circulation thereof, maintains solutions in proper suspension, when such solutions are used for the processing operation. For example, the term "liquid" as used herein is intended to comprise also a liquid vehicle in which there may be a suspension of relatively solid particles. With the invention arrangement, such particles are kept continuously in suspension and properly distributed throughout the liquid vehicle.

While certain specific examples of processes to which the invention is applicable have been mentioned, it should be pointed out that the apparatus of the invention may be used for such processes as pickling, bleaching, washing, burnishing and tanning. The apparatus may also be used for coating, particularly where the coating is to be applied in the form of a liquid or a suspension, the latter also coming under the definition of the term "liquid" as used herein.

It should be further noted that the apparatus is applicable not only to the processing of individual articles moving along an assembly line but can be applicable to the processing of an endless web moving along a continuous path which is substantially horizontal.

While a specific embodiment of the invention has been shown and described in detail to illustrate the application of the principles of the invention, it will be understood that the invention may be embodied otherwise without departing from such principles.

What is claimed is:

1. Ultrasonic processing apparatus comprising, in combination, means providing a substantially flat and substantially horizontal platform of relatively large area disposed in a path along which workpieces with a surface to be processed are moved; means defining an upwardly opening channel around the periphery of said platform; ultrasonic transducer means connected to said platform to transmit ultrasonic vibrations thereto; and means for supplying a processing liquid under pressure to said channel for pressure flow upwardly therein to cover the upper surface of said platform to provide an ultrasonically energized free standing wave elevated above said platform for contact with the workpiece surfaces to be processed.

2. Ultrasonic processing apparatus comprising, in combination, means providing a substantially flat and substantially horizontal platform of relatively large area disposed in a path along which workpieces with a surface to be processed are moved; means defining an upwardly opening channel around the periphery of said platform; ultrasonic transducer means connected to said platform to transmit ultrasonic vibrations thereto; means for supplying a processing liquid under pressure to said channel for pressure flow upwardly therein to cover the upper surface of said platform to provide an ultrasonically energized free standing wave elevated above said platform for contact with the workpiece surfaces to be processed; and means for continuously re-circulating excess liquid to said supplying means.

3. Ultrasonic processing apparatus, as claimed in claim 2, including a tank surrounding said platform; a partition dividing said tank into a pair of compartments, one of which is in communication with the entrance end of said channel and the other of which is in communication with said re-circulating means; said supplying means comprising a pump disposed between said compartments and circulating fluid under pressure from said other compartment into said one compartment.

4. Ultrasonic processing apparatus, as claimed in claim 3, in which said tank includes side walls and a bottom wall; wall means extending upwardly from said bottom wall and connected around the periphery of said platform to support said platform above said bottom wall; and vertically extending partition means supported in said tank and extending parallel with said wall means to define said upwardly opening channel.

5. Ultrasonic processing apparatus, as claimed in claim 4, in which said vertically extending partition means are supported upon said partition, which is horizontal, said partition having an opening communicating with said channel.

6. Ultrasonic processing apparatus, as claimed in claim 4, in which said bottom wall of said tank has an opening defined by said wall means; said transducer means being secured to the undersurface of said platform and being disposed in a compartment formed by said wall means and said platform, and accessible through said opening in said bottom wall.

7. Ultrasonic processing apparatus, as claimed in claim 4, in which said platform is substantially rectangular; said wall means comprising four joined walls each extending from a respective side of said platform vertically to said bottom wall; said partition means comprising four vertical joined partitions each extending parallel to and spaced from one of said platform supporting walls, and said vertical partitions with said supporting walls conjointly defining said channel; said vertical partitions including a first pair of parallel walls extending above said platform to a height less than the distance of the upper surface of said wave above said platform, and a second pair of parallel walls extending above said platform to a distance in excess of the height of said wave above said platform; said second pair of parallel walls being parallel to the direction of movement of said workpieces along said path.

8. Ultrasonic processing apparatus, comprising, in combination, a tank including substantially perpendicular side walls and a bottom wall; a substantially horizontal partition in said tank dividing said tank into an upper compartment and a lower compartment; a substantially flat and substantially horizontal platform of relatively large area disposed in said tank and in a path along which workpieces with a surface to be processed are moved; said platform being substantially rectangular in plan; joined vertical supporting walls each connecting an edge of said platform to said bottom wall; joined vertical partitions each extending upwardly from said horizontal partition in laterally spaced relation to a respective vertical supporting wall, said vertical partitions and said supporting walls defining an upwardly opening channel extending completely around the periphery of said platform; said horizontal partition having an opening therein bounded by said vertical partitions; a second opening in said horizontal partition spaced laterally from said vertical partitions; pump means disposed in said second opening and arranged to transfer fluid from the upper compartment of said tank to the lower compartment thereof under pressure in the lower compartment for upward flow of the liquid under pressure through said channel; ultrasonic transducer means connected to the undersurface of said platform within said supporting walls to transmit ultrasonic vibrations to said platform; whereby there is provided an ultrasonically energized free standing wave elevated above said platform for contact with the workpiece surfaces to be processed; a first pair of parallel vertical partitions having their upper edges at a level below the upper surface of said standing wave whereby excess liquid will flow over said first pair of vertical partitions into said upper compartment of said tank; and a second pair of parallel partitions having their upper peripheries above the upper surface of said standing wave laterally, said second pair of parallel partitions extending substantially parallel to the direction of movement of workpieces along said path.

9. Ultrasonic processing apparatus, as claimed in claim 8, in which said bottom wall of said tank is formed with an opening bounded by said supporting walls to provide a compartment for access to said ultrasonic transducer means.

References Cited in the file of this patent

UNITED STATES PATENTS

| | | |
|---|---|---|
| 2,845,077 | Branson | July 29, 1958 |
| 2,900,991 | Arnold | Aug. 25, 1959 |
| 2,923,304 | Vitense | Feb. 2, 1960 |
| 2,987,068 | Branson | June 6, 1961 |